(12) United States Patent
Püschner et al.

(10) Patent No.: US 7,579,679 B2
(45) Date of Patent: Aug. 25, 2009

(54) CHIPCARD WITH CONTACT AREAS AND METHOD FOR PRODUCING CONTACT AREAS

(75) Inventors: Frank Püschner, Kelheim (DE); Wolfgang Schindler, Regenstauf (DE); Ewald Simmerlein-Erlbacher, Haimhausen (DE); Peter Stampka, Burglengenfeld (DE)

(73) Assignee: Infineon Technologies AG (DE)

( * ) Notice: Subject to any disclaimer, the term of this patent is extended or adjusted under 35 U.S.C. 154(b) by 40 days.

(21) Appl. No.: 11/392,451

(22) Filed: Mar. 29, 2006

(65) Prior Publication Data

US 2006/0246628 A1 Nov. 2, 2006

Related U.S. Application Data

(63) Continuation of application No. PCT/DE2004/002118, filed on Sep. 23, 2004.

(30) Foreign Application Priority Data

Sep. 29, 2003 (DE) ................................ 103 45 257

(51) Int. Cl.
*H01L 23/02* (2006.01)
(52) U.S. Cl. ............................ 257/679; 257/E23.176; 257/737; 257/780; 257/781; 438/106; 438/121; 438/613

(58) Field of Classification Search ................. 257/678, 257/E23.176, 679, 709, E23.064, E21.505, 257/734, 737, 738, 780, 781; 438/121, 106, 438/613, 614; 340/572.7, 572.8; 29/843; 174/261; 204/192.25
See application file for complete search history.

(56) References Cited

U.S. PATENT DOCUMENTS

| | | | |
|---|---|---|---|
| 5,681,491 A | 10/1997 | Merlin et al. | |
| 6,232,563 B1 * | 5/2001 | Kim et al. | ................... 174/261 |
| 6,259,035 B1 | 7/2001 | Truggelmann et al. | |
| 6,644,552 B1 * | 11/2003 | Herslow | ..................... 235/488 |

FOREIGN PATENT DOCUMENTS

| | | |
|---|---|---|
| CN | 1220773 | 6/1999 |
| DE | 196 04 319 | 8/1997 |
| DE | 196 30 049 | 1/1998 |
| DE | 19630049 A1 * | 1/1998 |
| DE | 102 07 002 | 8/2003 |
| WO | WO 00/21027 | 4/2000 |

* cited by examiner

*Primary Examiner*—Chris C Chu
(74) *Attorney, Agent, or Firm*—Dickstein, Shapiro, LLP.

(57) ABSTRACT

A chip card with a chip module having an integrated circuit and, for external contacting, has on a main face a contact zone with a number of contact areas which are spaced apart from one another and are electrically connected to the integrated circuit. At least one contact area is made up of first functional regions with first surfaces and of second functional regions with second surfaces, and the first surfaces of the first functional regions lie higher with respect to the main face than the second surfaces of the second functional regions.

7 Claims, 2 Drawing Sheets

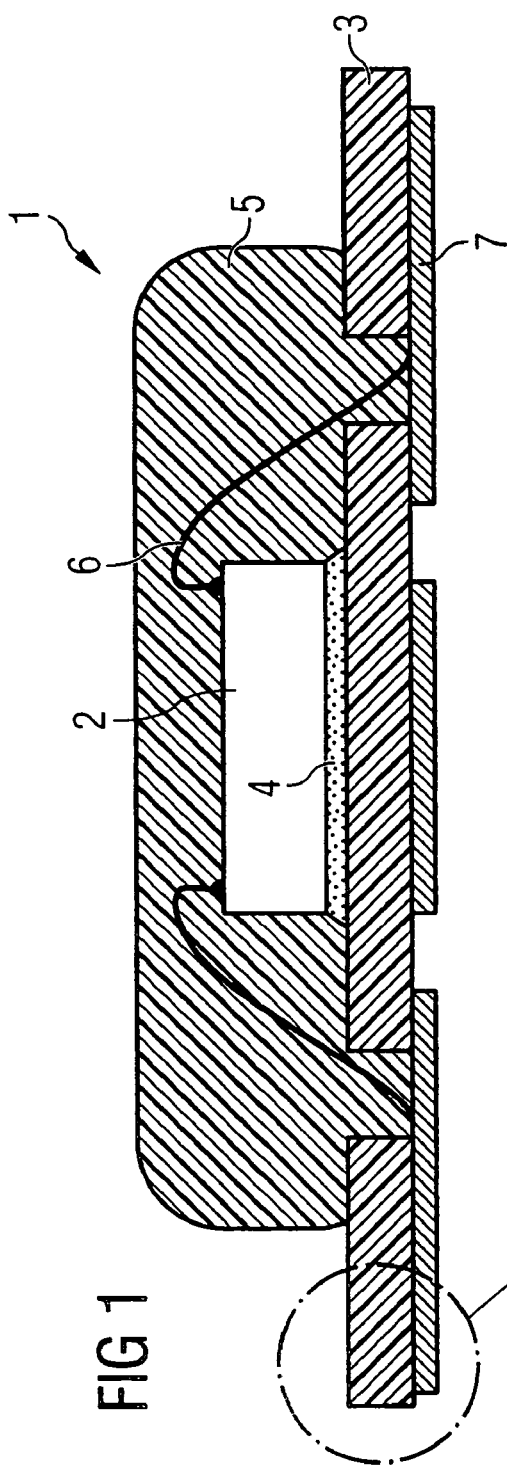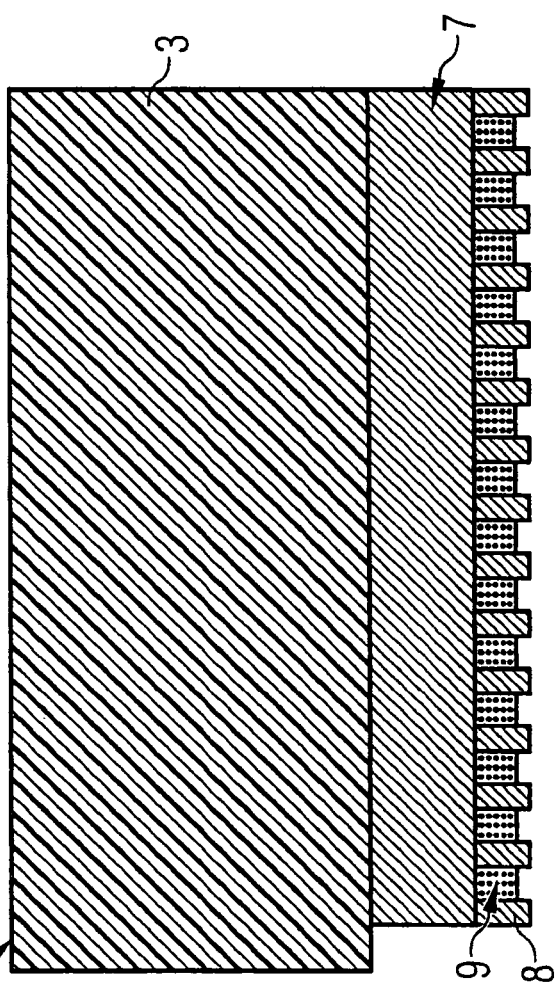

CHIPCARD WITH CONTACT AREAS AND METHOD FOR PRODUCING CONTACT AREAS

CROSS-REFERENCE TO RELATED APPLICATIONS

This application is based on International Application No. PCT/DE2004/002118 filed on Sep. 23, 2004, which claims priority to German Patent Application Serial No. 10345257.5, which was filed on Sep. 29, 2003. Both of these documents are incorporated herein by reference in their entireties.

BACKGROUND OF THE INVENTION

The invention relates to a chip card with a chip module which contains an integrated circuit and, for external contacting, has on a main face a contact zone with a number of contact areas which are spaced apart from one another and are electrically connected to the integrated circuit. At least one contact area is made up of first functional regions with first surfaces and of second functional regions with second surfaces. The invention also relates to a method for producing a contact area for a chip module of a chip card.

Chip cards have long been known and are being increasingly used for example as phone cards, identification cards or the like. There are standards which stipulate the dimensions and technical details of such chip cards. The standards are, for example, ISO 7810 and ISO 7816.

Chip cards with a chip module containing an integrated circuit have a contact zone, which according to the standards mentioned provides a total of 8 contact areas. The arrangement of these contact areas on the chip card is clearly stipulated by the standards mentioned. At present, the contact zone of the card comprises a suitable metallic surface, which is produced for example from Au, NiPdAg or similar materials. The individual contact areas of the contact zone are separated from one another in an isolating manner by separating channels. The outer configuration of the contact zone can be determined by the geometry of the separating channels, in compliance with the ISO standards mentioned.

A further possibility for configuring the contact zone is known from DE 196 30 049. In this case, the metallic contact areas are at least partially provided with an electrically conductive layer, the electrically conductive layer being arranged on the contact zone in such a way that it is free from any short-circuits with respect to the contact areas and is colored differently from the contact areas.

A disadvantage of this form of configuration is that the configuring layer on the contact areas is exposed to mechanical influences, such as abrasion for example. Furthermore, complex materials and special application processes have to be used for applying the electrically conductive layer to the contact areas.

BRIEF SUMMARY OF THE INVENTION

A chip card with a chip module, the chip module having an integrated circuit; and a carrier having a main face equipped with a contact zone with a number of contact areas which are spaced apart from one another and are electrically connected to the integrated circuit. At least one contact area is made up of first functional regions with first surfaces and of second functional regions with second surfaces, wherein the first surfaces of the first functional regions lie higher with respect to the main face than the second surfaces of the second functional regions.

BRIEF DESCRIPTION OF THE DRAWINGS

FIG. 1 shows a schematic cross-sectional view of a chip module.

FIG. 2 shows a schematic cross-sectional view of a preferred exemplary embodiment of the contact area of the chip card according to the invention.

DETAILED DESCRIPTION OF THE INVENTION

Figure 3:
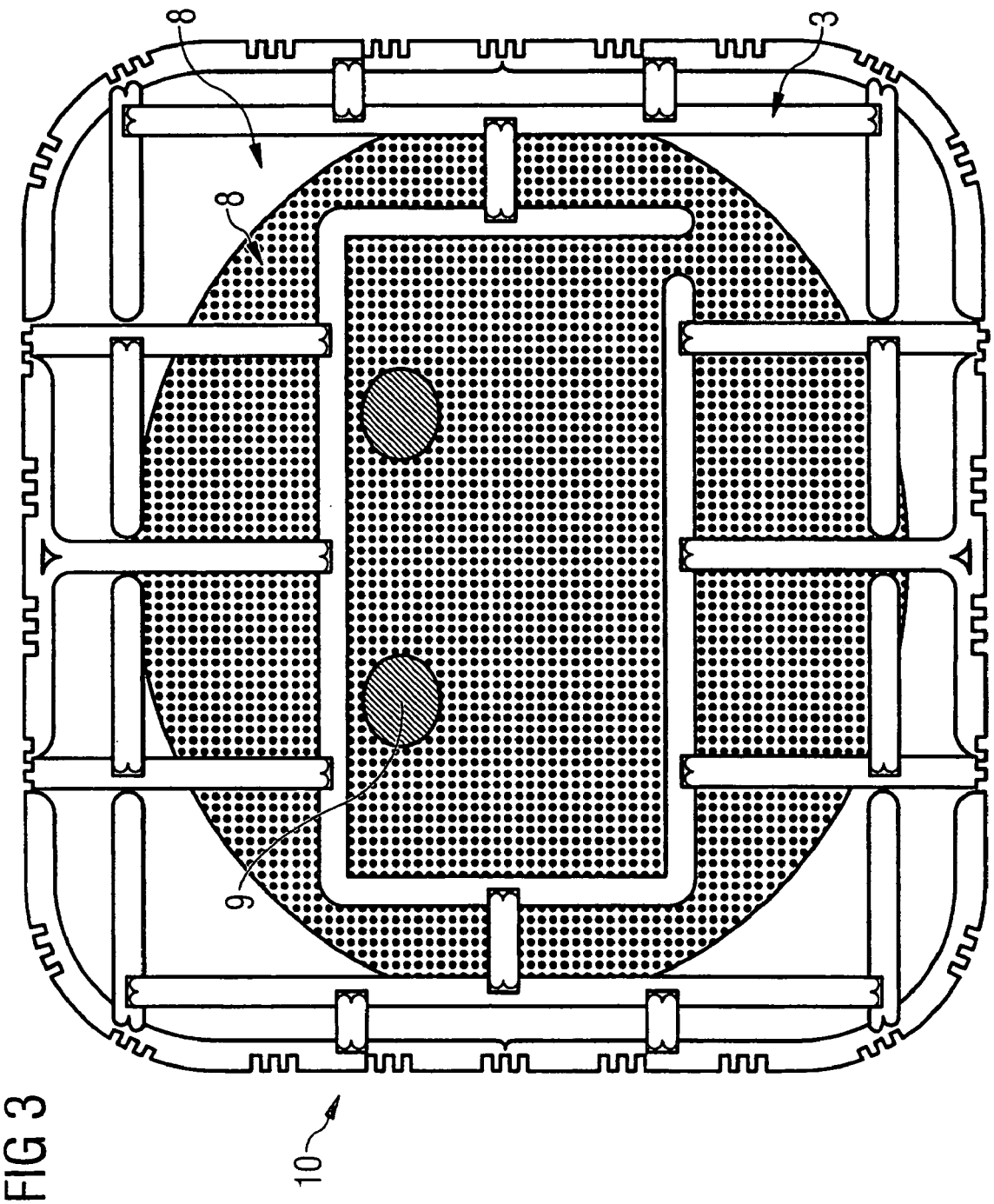
FIG. 3 shows a schematic plan view of a preferred exemplary embodiment of a contact zone of the chip card according to the invention.

The present invention provides a chip card with a chip module which contains an integrated circuit and has a contact zone with a number of contact areas. The contact areas can be produced inexpensively and in such a way that they are colored and can be graphically freely configured to thereby avoid restrictions of the surface functions of the contact areas, such as for example electrical conductivity and scratch resistance. Furthermore, the present invention provides a method for producing such a contact area for a chip card.

The invention relates to a chip card with a chip module which contains an integrated circuit and, for external contacting, has on a main face a contact zone with a number of contact areas which are spaced apart from one another and are electrically connected to the integrated circuit. At least one contact area is made up of first functional regions with first surfaces and of second functional regions with second surfaces, and the first surfaces of the first functional regions lying higher with respect to the main face than the second surfaces of the second functional regions.

One of the advantages of the chip card according to the present invention is that, by dividing the contact areas into first and second functional regions and by the first functional regions being raised above the second functional regions, external mechanical influences can be largely kept away from the second functional regions.

In one embodiment of the present invention, the first functional regions of the chip card are electrically conductive. As a result, the first functional regions undertake the task of the contact area of the electrical connection to an external terminal. Furthermore, it is advantageous if the second functional regions are electrically isolating. Consequently, materials which can be easily processed are used. Furthermore, as a result no undesired material deposition takes place on these second functional regions during a galvanic process step.

In a preferred embodiment of the chip card according to the invention, the two functional regions are formed with coloring substances, the entirety of the second functional regions presenting a graphic in plan view. Consequently, the contact zone can be individually configured and can also serve as an information carrier, which indicates for example from which chip manufacturer the chip module originates.

In another embodiment of the chip card according to the invention, crystals with exactly defined physical properties are incorporated in the second functional regions for use as security features. The fact that these crystals can be incorporated batch-dependently means that the chip module can be individualized and, by registering and storing in the chip the significant physical properties that are produced by the crystals, the chip module as such can already be authenticated before installation in a chip card.

The second functional regions typically take up at most 90% of the total contact area. As a result, it is ensured that there are an adequate number of first functional regions to perform the tasks to be undertaken by them, such as for example the electrical connection to an external terminal or the effect of providing protection against external mechanical influences.

In a further embodiment it is provided that at least some of the first functional regions lie at exactly defined points of the contact area. This allows the desired properties of the first functional regions to be placed at predetermined points in the contact area.

It is particularly preferred if the first functional regions and the second functional regions are arranged in a grid-like pattern and lie directly next to one another. This achieves the result in a particularly simple way that the desired properties of the first and second functional regions come into effect. For example, the grid patterning of the second functional regions also allows multicolored images to be built up, while the prominent and adjacent first functional regions protect the second functional regions from abrasion.

The invention also relates to a method for producing a contact area for a chip module of a chip card. A metallization layer is provided, second functional regions are applied to the metallization layer, and the first functional regions are applied to the metallization layer. The first functional regions are applied more thickly to the metallization layer than the second functional regions. This achieves the effect that the first functional regions are prominent above the second functional regions and consequently act as protection against external mechanical influences, such as abrasion for example.

The second functional regions are advantageously applied in a grid-like form to the metallization layer by a printing process. Consequently, printed images can be inexpensively applied to the metallization layer in a simple manner by known standard printing processes. The grid-like arrangement also makes it easy for multicolored images to be produced.

A preferred embodiment of the method according to the invention provides that crystals are additionally incorporated in the second functional regions for use as security features. The crystals can be incorporated batch-dependently and have significant physical properties. By registering and storing these physical properties in the chip, the chip module can be individualized and serves as a further security feature for authentication.

It is advantageous if different second functional regions are formed with different coloring substances. In this way, multicolored images can be produced.

A particularly advantageous development of the method according to the invention provides that the first functional regions are galvanically applied to the metallization layer. If the second functional regions consist of electrically nonconducting materials, the remaining gaps between the second functional regions and the first functional regions can be filled in a galvanic process carried out after the application of the second functional regions without the material from the galvanic process being deposited on the second functional regions.

It is preferred for the second functional regions to be applied directly next to the first functional regions. This produces a continuous contact area made up of first and second functional regions and makes best use of the positive properties of the first and second functional regions.

In FIG. 1, a conventional chip module 1 for use in a chip card is represented in a schematic cross-sectional view. The chip module 1 comprises a chip 2, which is attached on a carrier 3 with the aid of an adhesive 4. On the side of the carrier 3 that is facing away from the chip 2, a patterned metallization layer 7 is applied. Subregions of this metallization layer are electrically connected to the chip 2 with the aid of wires 6. The wires 6 are led through clearances in the carrier 3, in order that a connection can be established between the chip 2 and the metallization layer 7.

NiAu is used for example as the material for the patterned metallization layer 7 and is galvanically deposited. An epoxy film is used with preference as the carrier 3. The chip 2 and the wires 6 are encapsulated with a protective cladding 5, which for example consists of plastic.

In FIG. 2, a preferred exemplary embodiment of the contact area of the chip card according to the invention is likewise represented in a schematic cross-sectional view, in a partial detail of the chip module.

The contact area lies on the side of the carrier 3 that is away from the chip 2 and is built up on a metallization layer 7, which consists for example of galvanically deposited NiAu. The contact area is made up of first functional regions 8 and second functional regions 9 on the metallization layer 7. The first functional regions 8 and the second functional regions 9 lie next to one another and are arranged for example in the form of a grid. Art printing grid patterns or graphically distorted patterns are preferably to be used for the grid resolution.

The second functional regions 9 are applied to the metallization layer 7 by a printing process. Standard printing processes with, for example, pad, flexographic, screen, offset, letterpress, gravure or photo printing are suitable for this. Nonconducting dyes, such as all HKS, Pantone, RAL or special colors, opaque, transparent, luminescent, iridescent etc., are preferably used as materials, including in multicolor processes. Furthermore, crystal structures with exactly defined refractive index, dispersion, pleochroism, luminescence/fluorescence or absorption spectrum can be additionally incorporated in the dyes.

Following the application of the second functional regions 9, the first functional regions 8 are applied to the metallization layer 7 by a customary galvanic process. As for the metallization layer 7, NiAu is used for example as the material for the first functional regions 8, gold or some other metal layer also being applied to the surfaces of the first functional regions.

In FIG. 3, a schematic plan view of a preferred exemplary embodiment of a contact zone 10 of the chip card according to the invention is represented. The contact zone 10 is divided into a number of contact areas, which are spaced apart from one another. Through the separating channels of the contact areas, the carrier 3 lying thereunder can be seen.

The contact areas are divided into first functional regions 8 and second functional regions 9, a graphic being discernible from the entirety of the second functional regions 9, typically if they are viewed together with the separating channels of the contact areas.

According to this invention, freely configurable depictions/designs can be inexpensively produced in one and more colors on already metallized objects by the method according to the invention.

What is claimed as new and desired to be protected by Letters Patent of the United States is:

1. A chip card with a chip module, the chip module comprising: an integrated circuit; and
   a plurality of separate contact areas formed on an external face of the chip module and being electrically connected to the integrated circuit, wherein at least one of the plurality of contact areas comprises:
   a conductive layer; and
   first and second elements located next to one another in a non-overlapping manner on the conductive layer, wherein first ends of the first and second elements are in direct contact with a same side of the conductive layer, and second ends of the first elements lie higher with respect to the conductive layer than second ends of the second elements.

2. The chip card as claimed in claim 1, wherein the first elements are electrically conductive.

3. The chip card as claimed in claim 1, wherein the second elements are electrically isolating.

4. The chip card as claimed in claim 1, wherein the second elements are formed with coloring substances, the entirety of the second elements presenting a graphic in plan view.

5. The chip card as claimed in claim 1, wherein the second elements form at most 90% of the total contact area.

6. The chip card as claimed in claim 1, wherein at least some of the first elements lie at prescribed points of the at least one contact area.

7. The chip card as claimed in claim 1, wherein the first and second elements are arranged in a grid-like pattern.

\* \* \* \* \*